(12) United States Patent
Nishiura et al.

(10) Patent No.: US 9,035,429 B2
(45) Date of Patent: May 19, 2015

(54) GROUP III NITRIDE CRYSTAL SUBSTRATE

(71) Applicant: SUMITOMO ELECTRIC INDUSTRIES, LTD., Osaka (JP)

(72) Inventors: Takayuki Nishiura, Itami (JP); Keiji Ishibashi, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 13/681,049

(22) Filed: Nov. 19, 2012

(65) Prior Publication Data

US 2013/0075867 A1   Mar. 28, 2013

Related U.S. Application Data

(60) Continuation of application No. 12/795,177, filed on Jun. 7, 2010, now Pat. No. 8,338,299, which is a division of application No. 11/797,131, filed on May 1, 2007, now abandoned.

(30) Foreign Application Priority Data

May 1, 2006  (JP) .................................. 2006-127443

(51) Int. Cl.
| | |
|---|---|
| *H01L 29/20* | (2006.01) |
| *H01L 29/04* | (2006.01) |
| *H01L 21/306* | (2006.01) |
| *C09G 1/02* | (2006.01) |
| *C30B 29/40* | (2006.01) |
| *C30B 33/00* | (2006.01) |
| *H01L 21/02* | (2006.01) |
| *H01L 29/30* | (2006.01) |

(52) U.S. Cl.
CPC ............ *H01L 21/30625* (2013.01); *C09G 1/02* (2013.01); *C30B 29/403* (2013.01); *C30B 33/00* (2013.01); *H01L 21/02024* (2013.01); *H01L 29/30* (2013.01)

(58) Field of Classification Search
USPC ........................... 257/64, 65, 75, E21.23, 615
See application file for complete search history.

(56) References Cited

U.S. PATENT DOCUMENTS

| | | | |
|---|---|---|---|
| 6,399,500 B1 | 6/2002 | Porowski et al. | |
| 6,488,767 B1 | 12/2002 | Xu et al. | |
| 2002/0121863 A1* | 9/2002 | Morishita | ................. 315/169.3 |
| 2002/0185054 A1 | 12/2002 | Xu et al. | |
| 2004/0144300 A1* | 7/2004 | Kitaoka et al. | .................... 117/2 |

FOREIGN PATENT DOCUMENTS

EP   1 717 286 A1   11/2006

OTHER PUBLICATIONS

European Search Report issued in European Patent Application No. EP 07 00 7629 dated on Aug. 21, 2007.

* cited by examiner

*Primary Examiner* — Hung Vu
(74) *Attorney, Agent, or Firm* — McDermott Will & Emery LLP

(57) ABSTRACT

There is provided a method of processing a surface of a group III nitride crystal, that includes the steps of: polishing a surface of a group III nitride crystal with a polishing slurry containing abrasive grains; and thereafter polishing the surface of the group III nitride crystal with a polishing liquid at least once, and each step of polishing with the polishing liquid employs a basic polishing liquid or an acidic polishing liquid as the polishing liquid. The step of polishing with the basic or acidic polishing liquid allows removal of impurity such as abrasive grains remaining on the surface of the group III nitride crystal after it is polished with the slurry containing the abrasive grains.

2 Claims, 1 Drawing Sheet

GROUP III NITRIDE CRYSTAL SUBSTRATE

RELATED APPLICATIONS

This application is a Continuation of U.S. Ser. No. 12/795,177, filed on Jun. 7, 2010, now U.S. Pat. No. 8,338,299, which is a Divisional of U.S. Ser. No. 11/797,131, filed on May 1, 2007, now abandoned, claiming priority of Japanese Patent Application No. 2006-127443, filed on May 1, 2006, the entire contents of each of which are hereby incorporated by reference.

BACKGROUND OF THE INVENTION

1. Field of the Invention

The present invention relates to a method of processing a surface of group III nitride crystal used for a substrate or the like of a light emitting element, an electronic element, a semiconductor sensor and a similar semiconductor device, and a group III nitride crystal substrate obtained by such method.

2. Description of the Background Art

Group III nitride crystal is significantly useful as a material for forming a substrate of a light emitting element, an electronic element, a semiconductor sensor and a similar semiconductor device. Group III nitride crystal as referred to herein indicates a crystal formed of a group III element and nitrogen, such as $Al_xGa_yIn_{1-x-y}N$ crystal or the like, wherein $0 \le x$, $0 \le y$, and $x+y \le 1$.

A group III nitride crystal substrate used as a substrate of a semiconductor device is obtained by working a perimeter of a group III nitride crystal to have a geometry, then slicing it to have a predetermined thickness, and polishing its surface to be flat.

As the group III nitride crystal has a chemically stable surface, the surface is mechanically or chemically mechanically polished with a slurry containing a abrasive grains. For example, U.S. Pat. No. 6,488,767 discloses using a slurry containing abrasive grains of $SiO_2$ or $Al_2O_3$ to chemically mechanically polish a wafer of $Al_xGa_yIn_{1-x-y}N$, wherein $0 \le x$, $0 \le y$, and $x+y \le 1$.

Consequently after the group III nitride crystal has been polished with the slurry containing the abrasive grains it has a surface with the slurry containing the abrasive grains, residues resulting from polishing, and other impurities remaining thereon. Of such impurities, the liquid of the slurry is removed typically by polishing or washing with pure water. Simply polishing or washing with pure water, however, cannot sufficiently remove the abrasive grains, residues resulting from polishing, and the like remaining on the surface of the group III nitride crystal.

Accordingly, U.S. Pat. No. 6,399,500 proposes polishing with a basic polishing liquid that does not contain abrasive grains, and thereafter polishing with pure water.

SUMMARY OF THE INVENTION

U.S. Pat. No. 6,399,500, however, employs a basic component of NaOH, KOH, or the like. As such, ions of Na, K or a similar alkaline metal element readily remain on a surface of a group III nitride crystal.

Furthermore, if a slurry used in polishing contains abrasive grains other than $SiO_2$ and $Al_2O_3$, such as $CeO_2$, $Fe_2O_3$, $Fe_3O_4$, $SnO_2$, $Cr_2O_3$, and the like, a basic polishing liquid and pure water cannot sufficiently remove them.

The present invention contemplates a method of processing a surface of a group III nitride crystal, that can remove abrasive grains or similar impurities remaining on the surface of the group III nitride crystal after it has been polished with a slurry containing the abrasive grains.

The present invention is a method of processing a surface of a group III nitride crystal, that includes the steps of polishing a surface of a group III nitride crystal with a polishing slurry containing abrasive grains; and thereafter polishing the surface of the group III nitride crystal with a polishing liquid at least once. Each step of polishing with the polishing liquid employs one of a basic polishing liquid and an acidic polishing liquid as the polishing liquid. The basic polishing liquid contains at least one type selected from the group consisting of a base having at least any of C, O, H and N as a constituent element, a salt thereof and an oxidizer having at least any of C, O, H and N as a constituent element and has a pH of at least 8.5 and at most 14, and if the pH is represented by a value x and the basic polishing liquid has an oxidation reduction potential represented by a value y represented in mV, values x and y satisfy the following expression:

$$y > -50x + 800 \quad \text{(i), and}$$

the acidic polishing liquid contains at least one type selected from the group consisting of an acid having at least any of C, O, H and N as a constituent element, a salt thereof and an oxidizer having at least any of C, O, H and N as a constituent element and has a pH of at least 1.5 and at most 6, and if the pH is represented by a value x and the acidic polishing liquid has an oxidation reduction potential represented by a value y represented in mV, values x and y satisfy the following expression:

$$y > -50x + 800 \quad \text{(i).}$$

Furthermore in the present method of processing a surface of a group III nitride crystal the basic polishing liquid can further include a chelate. Furthermore the steps of polishing with the polishing liquid can include the steps of polishing with the basic polishing liquid and thereafter polishing with the acidic polishing liquid. Furthermore the steps of polishing with the polishing liquid can include the steps of polishing with the acidic polishing liquid and thereafter polishing with the basic polishing liquid.

Furthermore the present invention is a group III nitride crystal substrate obtained by the aforementioned method of processing a surface of a group III nitride crystal.

The present invention can thus provide a method of processing a surface of a group III nitride crystal, that can remove impurity such as abrasive grains remaining on the surface of the group III nitride crystal after it is polished with a slurry containing the abrasive grains.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
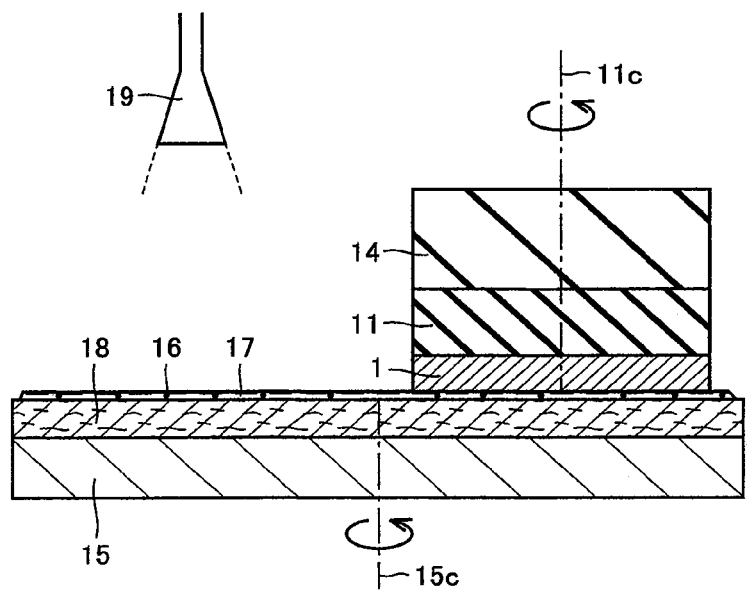
FIG. 1 is a schematic cross section for illustrating the step of polishing with a polishing slurry containing abrasive grains in a method of processing a surface of a group III nitride crystal in accordance with the present invention.
Figure 2:
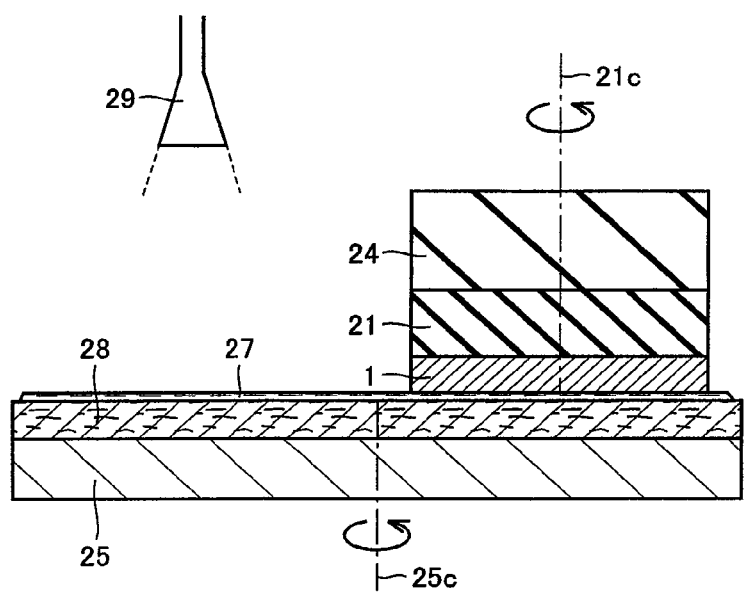
FIG. 2 is a schematic cross section for illustrating the step of polishing with a polishing liquid in a method of processing a surface of a group III nitride crystal in accordance with the present invention.

The present invention provides a method of processing a surface of a group III nitride crystal in one embodiment with reference to FIGS. 1 and 2 including the step of polishing a surface of a group III nitride crystal 1 with a polishing liquid 27 at least once after polishing the surface with a polishing slurry 17 containing abrasive grains 16, and each step of polishing with polishing liquid 27 employs a basic polishing liquid or an acidic polishing liquid as polishing liquid 27.

Herein the basic polishing liquid contains at least one type selected from the group consisting of a base having at least any of C, O, H and N as a constituent element, a salt thereof and an oxidizer and has a pH of at least 8.5 and at most 14, and if the pH is represented by a value x and the polishing liquid has an oxidation reduction potential (ORP) represented by a value y represented in mV, values x and y satisfy the following expression:

$$y > -50x + 800 \quad \text{(i)}.$$

Furthermore, the acidic polishing liquid contains at least one type selected from the group consisting of an acid having at least any of C, O, H and N as a constituent element, a salt thereof and an oxidizer and has a pH of at least 1.5 and at most 6, and if the pH is represented by a value x and the polishing liquid has an ORP represented by a value y represented in mV, values x and y satisfy the following expression:

$$y > -50x + 800 \quad \text{(i)}$$

Herein, an ORP indicates an energy level (or potential) determined by equilibrium between an oxidant and a reducer coexisting in a solution. An ORP obtained by measurement is a value for a reference electrode. For different types of reference electrodes, the same solution's measured value apparently varies. In general academic articles and the like, a normal hydrogen electrode (NHE) is often used as the reference electrode. In the present application an ORP is indicated as a value provided such that the normal hydrogen electrode (NHE) serves as the reference electrode.

In such method of processing a surface of a group III nitride crystal, after group III nitride crystal 1 has a surface polished with polishing slurry 17 containing abrasive grains 16, the above described basic or acidic polishing liquid can be used to polish the surface at least once to effectively remove the abrasive grains or similar impurities remaining on the surface of the group III nitride crystal after it is polished with the slurry containing the abrasive grains.

Polishing with a polishing slurry containing abrasive grains, as referred to in the present embodiment, indicates mechanically or chemically mechanically polishing a surface of group III nitride crystal 1 with a polishing slurry containing abrasive grains. For example, with reference to FIG. 1, a polishing pad 18 fixed on a surface plate 15 is rotated around an axis of rotation 15c, while a polishing slurry 17 is fed through a polishing slurry feeding port 19 onto polishing pad 18, and on a crystal holder 11 fixing group III nitride crystal 1 a weight 14 is placed and rotated around an axis of rotation 11c of the holder to press group III nitride crystal 1 against polishing pad 18 to mechanically or chemically mechanically polish the surface of group III nitride crystal 1.

Abrasive grains 16 contained in polishing slurry 17 may be any abrasive grains that can polish the surface of the group III nitride crystal, and can be formed of material such as $SiO_2$, $Al_2O_3$, $CeO_2$, $Fe_2O_3$, $Fe_3O_4$, $SnO_2$, $Cr_2O_3$. Abrasive grains 16 may be a mixture of two or more types of materials selected from the above indicated materials or a complex compound thereof. If abrasive grains formed of two or more different types of materials are used, high hardness abrasive grains higher in hardness than the group III nitride crystal and low hardness abrasive grains lower in hardness than the group III nitride crystal are preferably used to enhance the surface of the crystal in smoothness and polish it faster. The high hardness abrasive grains can be formed for example of $Al_2O_3$, $Cr_2O_3$. The low hardness abrasive grains can be formed for example of $SiO_2$, $CeO_2$, $Fe_2O_3$, $Fe_3O_4$, $SnO_2$. The group III nitride crystal and the abrasive grains are compared in hardness by bringing the former and the latter into contact with each other, and one that has been scratched is determined as being lower in hardness. If both are scratched, they are determined as being equal in hardness.

For polishing slurry 17, any medium may be used. Preferably, however, water is used. Furthermore, to provide an enhanced chemical polishing effect, preferably, polishing slurry 17 is acidic with a pH of at most 6 or basic with a pH of at least 8 and/or if the pH is represented by a value x and the slurry has an ORP represented by a value y represented in mV then the following expression:

$$y > -50x + 1000 \quad \text{(ii)}$$

is satisfied. Accordingly, preferably, polishing slurry 17 contains at least one type selected from the group consisting of an acid and a salt thereof, a base and a salt thereof, and an oxidizer.

Herein, the acid and the salt thereof can include nitric acid, carbonic acid, hydrochloric acid, sulfuric acid, phosphoric acid and like inorganic acids, formic acid, acetic acid, citric acid, malic acid, tartaric acid, succinic acid, phthalic acid, fumaric acid, and like organic acids, and a salt thereof. The base and the salt thereof can include $NH_4OH$, amine, NaOH, KOH, and a salt thereof. The oxidizer can include nitric acid, oxygenated water, ozone as well as chlorinated isocyanuric acid, chlorinated isocyanurate, permanganate, thiosulfate, persulfate and the like. Note that preferably, polishing slurry 17 contains the acid and the salt thereof, the base and the salt thereof, and the oxidizer that have at least any of C, O, H and N as a constituent element to facilitate removing impurities.

Polishing with a polishing liquid, as referred to in the present embodiment, indicates mainly chemically polishing a surface of group III nitride crystal 1 with a polishing liquid which does not contain abrasive grains. For example, with reference to FIG. 2, a polishing pad 28 fixed on a surface plate 25 is rotated around an axis of rotation 25c, while a polishing liquid 27 is fed through a polishing liquid feeding port 29 onto polishing pad 28, and on a crystal holder 21 fixing group III nitride crystal 1 a weight 24 is placed and rotated around an axis of rotation 21c of the holder to press group III nitride crystal 1 against polishing pad 28 to remove impurities such as abrasive grains remaining on the surface of group III nitride crystal 1 after it is polished with slurry. Note that the impurities include the abrasive grains as well as the slurry, Na, Cu, Zn and similar metallic impurities contained in the slurry, and residues that result from polishing and derive from the polishing pad and/or the group III nitride crystal.

In the present embodiment the step of polishing with the polishing liquid is performed at least once. Performing the step of polishing with the polishing liquid more than once can remove more impurities on the surface of the group III nitride crystal. Note that for the polishing liquid any medium may be used, although water is preferably used to more effectively remove impurities.

In the present embodiment each step of polishing with the polishing liquid employs a basic polishing liquid or an acidic polishing liquid as the polishing liquid. The basic or acidic polishing liquid can be used, depending on the type of abrasive grains used in the step of polishing with a polishing slurry, to more effectively remove impurities including the abrasive grains.

If the step of polishing with a polishing slurry is performed with abrasive grains containing $SiO_2$, $Al_2O_3$ or the like as a material, the basic polishing liquid is preferably used, since $SiO_2$, $Al_2O_3$ and the like are readily soluble in basic, aqueous liquid. Hereinafter a material, such as $SiO_2$, $Al_2O_3$, readily soluble in the basic polishing liquid will be referred to as a base soluble material.

Such basic polishing liquid contains at least one type selected from the group consisting of a base having at least any of C, O, H and N as a constituent element, a salt thereof and an oxidizer and has a pH of at least 8.5 and at most 14, and if the pH is represented by a value x and the polishing liquid has an ORP represented by a value y represented in mV, values x and y satisfy the following expression:

$$y > -50x + 800 \quad (i).$$

If the basic polishing liquid is a weakly basic polishing liquid having a pH smaller than 8.5 or $y \leq 50x + 800$ it removes impurities less effectively. Furthermore, the base, the salt thereof and the oxidizer that have at least any of C, O, H and N as a constituent element, i.e., exclude an element other than C, O, H and N, such as Na, K and the like, as an element can contribute to reduced impurities deriving from the polishing liquid remaining on the surface of the group III nitride crystal.

The base having at least any of C, O, H and N as a constituent element and a salt thereof can include trimethyl ammonium oxide and similar, quaternary ammonium salts, $NH_4OH$, amines, and the like. The oxidizer having at least any of C, O, H and N as a constituent element can include nitric acid, oxygenated water, ozone, and the like.

If the step of polishing with the polishing slurry is performed with abrasive grains formed of material such as $CeO_2$, $Fe_2O_3$, $Fe_3O_4$, $SnO_2$, $Cr_2O_3$, the acidic polishing liquid is preferably used, since $CeO_2$, $Fe_2O_3$, $Fe_3O_4$, $SnO_2$, $Cr_2O_3$, and the like are readily soluble in acidic, aqueous liquid. Hereinafter a material, such as $CeO_2$, $Fe_2O_3$, $Fe_3O_4$, $SnO_2$, $Cr_2O_3$, readily soluble in the acidic polishing liquid will be referred to as an acid soluble material.

Such acidic polishing liquid contains at least one type selected from the group consisting of an acid having at least any of C, O, H and N as a constituent element, a salt thereof and an oxidizer and has a pH of at least 1.5 and at most 6, and if the pH is represented by a value x and the polishing liquid has an ORP represented by a value y represented in mV, values x and y satisfy the following expression:

$$y > -50x + 800 \quad (i).$$

If the acidic polishing liquid is a weakly acidic polishing liquid having a pH larger than 6 or $y \leq 50x + 800$ it removes impurities less effectively. Furthermore, the acid, the salt thereof and the oxidizer that have at least any of C, O, H and N as a constituent element, i.e., exclude an element other than C, O, H and N, such as S, P, Na, K and the like, as an element can contribute to reduced impurities deriving from the polishing liquid remaining on the surface of the group III nitride crystal.

Herein the acid having at least any of C, O, H and N as a constituent element and the salt thereof can include nitric acid and like inorganic acids, formic acid, acetic acid, citric acid, malic acid, tartaric acid, succinic acid, phthalic acid, fumaric acid, and like organic acids, and a salt thereof. The oxidizer having at least any of C, O, H and N as a constituent element can include nitric acid, oxygenated water, ozone and the like.

Thus the basic and acidic polishing liquids contain a base and a salt thereof, an acid and a salt thereof, and an oxidizer that all contain at least any of C, O, H and N as a constituent element. Such feature can reduce residual impurities deriving from the polishing liquid. Herein in order to enhance the polishing liquid in ORP to further reduce impurities remaining on the surface of the group III nitride crystal the basic and acidic polishing liquids preferably contain an oxidizer having at least any of C, O, H and N as a constituent element. Furthermore, the basic and acidic polishing liquids both satisfy expression (1). Such feature can enhance the effect of removing impurities on the surface of the group III nitride crystal.

Furthermore in the present embodiment the above described basic polishing liquid preferably contains a chelate to effectively remove impurities, metallic ions in particular, remaining on the surface of the group III nitride crystal after it is polished with a slurry. Such chelate is not particularly limited to any specific chelate. Preferably, however, ethylene diamine tetra acetic acid (EDTA), methylene sulfonic acid, ethylenediaminedi(orthohydroxyphenylacetic) acid (EDDHA), and a derivative thereof are preferably used as they are significantly capable of capturing metallic ions.

Second Embodiment

The present invention provides the method of processing a surface of a group III nitride crystal in another embodiment with reference to FIGS. 1 and 2 including the step of polishing a surface of group III nitride crystal 1 with polishing liquid 27 at least once after polishing the surface with polishing slurry 17 containing abrasive grains 16, and the step of polishing with polishing liquid 27 includes the step of polishing with a basic polishing liquid and polishing with an acidic polishing liquid. Herein the basic and acidic polishing liquids are those described in the first embodiment.

Polishing with the basic polishing liquid can effectively remove impurities including a base soluble material such as $SiO_2$, $Al_2O_3$ and the like, and polishing with the acidic polishing liquid can effectively remove impurities including an acid soluble material, which is often an acid soluble metal oxide, such as $CeO_2$, $Fe_2O_3$, $Fe_3O_4$, $SnO_2$, $Cr_2O_3$, and the like.

The present embodiment can effectively remove impurities on a surface of a group III nitride crystal in a case where the step of polishing with a slurry is performed such that abrasive grains containing such a base soluble material as described above and abrasive grains containing such an acid soluble material as described above are used and a case where the step of polishing with a slurry is performed such that abrasive grains containing such a base soluble material as described above and such an acid soluble material as described above are used.

In the present embodiment, in particular, polishing with the basic polishing liquid and thereafter polishing with the acidic polishing liquid can particularly effectively remove impurities including such an acid soluble material as described above.

Third Embodiment

The present invention provides the method of processing a surface of a group III nitride crystal in another embodiment with reference to FIGS. 1 and 2 including the step of polishing a surface of group III nitride crystal 1 with polishing liquid 27 at least once after polishing the surface with polishing slurry 17 containing abrasive grains 16, and the step of polishing with polishing liquid 27 includes the step of polishing with an acidic polishing liquid and polishing with a basic polishing liquid. Herein the acidic and basic polishing liquids are those described in the first embodiment.

Polishing with the acidic polishing liquid can effectively remove impurities including an acid soluble material such as $CeO_2$, $Fe_2O_3$, $Fe_3O_4$, $SnO_2$, $Cr_2O_3$ and the like, and polishing with the basic polishing liquid can effectively remove impurities including a base soluble material such as $SiO_2$, $Al_2O_3$, and the like.

The present embodiment can effectively remove impurities on a surface of a group III nitride crystal in a case where the step of polishing with a slurry is performed such that abrasive grains containing such a base soluble material as described above and abrasive grains containing such an acid soluble material as described above are used and a case where the step of polishing with a slurry is performed such that abrasive grains containing such a base soluble material as described above and such an acid soluble material as described above are used.

In the present embodiment, in particular, polishing with the acidic polishing liquid and thereafter polishing with the basic polishing liquid can particularly effectively remove impurities including $SiO_2$ or a similar, non-metallic material or $Al_2O_3$ or a similar material.

Fourth Embodiment

The present embodiment provides a group III nitride crystal substrate, which is obtained by the method of processing a surface of a group III nitride crystal, as described in the first to third embodiments. The present embodiment can provide a group III nitride crystal substrate having a surface with less impurities remaining thereon, since it is processed by a method, as has been described in the first to third embodiments, including the step of polishing the surface of the group III nitride crystal with a polishing liquid at least once after polishing it with a polishing slurry containing abrasive grains, and each step of polishing with the polishing liquid employs the above described basic or acidic polishing liquid as the polishing liquid.

When the group III nitride crystal substrate, such as a GaN substrate, thus obtained is employed to epitaxially grow a group III nitride crystal layer, such as $In_{1-x}Ga_xN$ layer, thereon, wherein $0 \le x \le 1$, their interface can have a reduced impurity concentration. Employing the group III nitride crystal substrate and layer to fabricate an LED allows the LED to have a less varying operating current and achieve increased emission intensity. Furthermore, employing the above described group III nitride crystal substrate and layer to fabricate an electronic device can contribute to a reduced amount of current leakage.

EXAMPLES

Hereinafter the present method of processing a surface of a group III nitride crystal and the present group III nitride crystal substrate obtained thereby will specifically be described with reference to the following comparative examples and present examples.

First Comparative Example

On an underlying substrate implemented by a sapphire substrate a GaN crystal was grown by hydride vapor phase epitaxy (HYPE) to have a thickness of 1 mm. The GaN crystal had a perimeter ground and thus beveled. Subsequently it was sliced with a slicer having an inner peripheral edge and had a surface ground to provide a GaN crystal substrate having a thickness of 0.5 mm.

With reference to FIG. 1, the GaN crystal substrate (or group III nitride crystal 1) had a surface polished with polishing slurry 17 which contains abrasive grains of $SiO_2$ having an average grain size of 0.05 µm and has a pH of 3.3 and an ORP of 1,100 mV. Polishing pad 18 was implemented by a polyurethane suede pad (Supreme RN-R produced by Nitta Haas Incorporated) and surface plate 15 was implemented by a stainless steel surface plate. The surface was polished for 60 minutes such that a polishing pressure of 19.6 kPa (or 200 gf/cm$^2$) to 98 kPa (or 1,000 gf/cm$^2$) was applied and the GaN crystal substrate (or group III nitride crystal 1) and surface plate 15 were rotated 30 to 120 times/min.

The GaN crystal substrate was then immersed in pure water and an ultrasonic wave of 1 MHz was applied to the pure water to wash a surface of the GaN crystal substrate for 20 minutes. Then, total reflection x ray fluorescence (TXRF) was employed to provide an element analysis of impurity remaining on the surface of the GaN crystal substrate having been washed with the pure water. $5 \times 10^{12}$ Si atoms/cm$^2$ were detected.

First Example

With reference to FIG. 2, the GaN crystal substrate of the first comparative example was polished with basic polishing liquid 27 of an aqueous solution containing 0.1 mol/l of tetra methyl ammonium oxide and 0.05 mol/l of hydrogen peroxide and having a pH of 12 and an ORP of 800 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min. Then, similarly as has been described in the first comparative example, the GaN crystal substrate had its surface washed with pure water. The GaN crystal substrate washed with pure water was examined for impurity remaining on the surface. $1 \times 10^{11}$ Si atoms/cm$^2$ were detected. Polishing with the basic polishing liquid, as described in the present example, has reduced significantly more of impurity remaining on the surface of the GaN crystal substrate than the first comparative example.

Second Comparative Example

On an underlying substrate implemented by a ZnO substrate a GaN crystal was grown by hydride vapor phase epitaxy (HVPE) to have a thickness of 0.6 mm. The ZnO substrate was chemically etched away to obtain a GaN crystal substrate. The GaN crystal substrate had a perimeter ground and thus beveled and then had a surface lapped with abrasive diamond grains and etched with 0.5 mol/l of an aqueous solution of KOH to obtain a GaN crystal substrate having a thickness of 0.45 mm.

With reference to FIG. 1, the GaN crystal substrate (or group III nitride crystal 1) had a surface polished with polishing slurry 17 which contains abrasive grains of $Cr_2O_3$ having an average grain size of 0.3 µm and has a pH of 2 and an ORP of 800 mV. Polishing pad 18 was implemented by a polyurethane suede pad (Supreme RN-R produced by Nitta Haas Incorporated) and surface plate 15 was implemented by a stainless steel surface plate. The surface was polished for 60 minutes such that a polishing pressure of 19.6 kPa (or 200 gf/cm$^2$) to 98 kPa (or 1,000 gf/cm$^2$) was applied and the GaN crystal substrate (or group III nitride crystal 1) and surface plate 15 were rotated 30 to 120 times/min.

Then, similarly as has been described in the first comparative example, the GaN crystal had its surface washed. The GaN crystal substrate washed with pure water was examined for impurity remaining on the surface. 1×10$^{13}$ Cr atoms/cm$^2$ were detected.

Second Example

With reference to FIG. 2, the GaN crystal substrate of the second comparative example was polished with acidic polishing liquid 27 of an aqueous solution containing 0.1 mol/l of citric acid and 0.1 mol/l of hydrogen peroxide and having a pH of 3.5 and an ORP of 700 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min. Then, similarly as has been described in the first comparative example, the GaN crystal substrate had its surface washed with pure water. The GaN crystal substrate washed with pure water was examined for impurity remaining on the surface. 1×10$^{10}$ Cr atoms/cm$^2$ were detected. Polishing with the acidic polishing liquid, as described in the present example, has reduced significantly more of impurity remaining on the surface of the GaN crystal substrate than the second comparative example.

Third Comparative Example

On an underlying substrate implemented by a GaAs substrate a GaN crystal was grown by hydride vapor phase epitaxy (HVPE) to have a thickness of 3 mm. The GaAs substrate was chemically etched away to obtain a GaN crystal substrate. The GaN crystal was sliced with a wire saw and then had a surface dry etched to obtain a GaN crystal substrate having a thickness of 0.5 mm.

With reference to FIG. 1, the GaN crystal substrate (or group III nitride crystal 1) had a surface polished with polishing slurry 17 which contains abrasive grains of Fe$_2$O$_3$ having an average grain size of 0.3 μm and has a pH of 2 and an ORP of 800 mV. Polishing pad 18 was implemented by a polyurethane suede pad (Supreme RN-R produced by Nitta Haas Incorporated) and surface plate 15 was implemented by a stainless steel surface plate. The surface was polished for 60 minutes such that a polishing pressure of 19.6 kPa (or 200 gf/cm$^2$) to 98 kPa (or 1,000 gf/cm$^2$) was applied and the GaN crystal substrate (or group III nitride crystal 1) and surface plate 15 were rotated 30 to 120 times/min.

Then, similarly as has been described in the first comparative example, the GaN crystal had its surface washed. The GaN crystal substrate washed with pure water was examined for impurity remaining on the surface. 1×10$^{12}$ Fe atoms/cm$^2$ were detected.

Third Example

With reference to FIG. 2, the GaN crystal substrate of the third comparative example was polished with basic polishing liquid 27 of an aqueous solution containing 0.1 mol/l of tri methyl ammonium oxide and 0.1 mol/l of hydrogen peroxide and having a pH of 11 and an ORP of 500 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min. Then, similarly as has been described in the first comparative example, the GaN crystal substrate had its surface washed with pure water. The GaN crystal substrate washed with pure water was examined for impurity remaining on the surface. 1×10$^{11}$ Fe atoms/cm$^2$ were detected. Polishing with the basic polishing liquid, as described in the present example, has reduced significantly more of impurity remaining on the surface of the GaN crystal substrate than the third comparative example.

Fourth Example

With reference to FIG. 2, the GaN crystal substrate of the third example was polished with acidic polishing liquid 27 of an aqueous solution containing 0.1 mol/l of malic acid and 0.1 mol/l of hydrogen peroxide and having a pH of 2.5 and an ORP of 1,000 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min. Then, similarly as has been described in the first comparative example, the GaN crystal substrate had its surface washed with pure water. The GaN crystal substrate washed with pure water was examined for impurity remaining on the surface. 1×10$^{10}$ Fe atoms/cm$^2$ were detected. Polishing with the acidic polishing liquid, as described in the present example, has reduced significantly more of impurity remaining on the surface of the GaN crystal substrate than the third comparative example and the third present example.

Fourth Comparative Example

On an underlying substrate implemented by a sapphire substrate a GaN crystal was grown by organometallic vapor phase epitaxy (OMPVE) to have a thickness of 0.3 mm. That side of the sapphire substrate which is opposite to the GaN crystal was exposed to laser light to separate the GaN crystal from the sapphire substrate to obtain a GaN crystal substrate. The GaN crystal substrate then had a perimeter ground and thus beveled and was then etched with an aqueous solution containing 0.1 mol/l of choline to obtain a GaN crystal substrate having a thickness of 0.35 mm.

With reference to FIG. 1, the GaN crystal substrate (or group III nitride crystal 1) had a surface polished with polishing slurry 17 which contains abrasive grains of SnO$_2$ having an average grain size of 3 μm and has a pH of 3 and an ORP of 700 mV. Polishing pad 18 was implemented by a polyurethane suede pad (Supreme RN-R produced by Nitta Haas Incorporated) and surface plate 15 was implemented by a stainless steel surface plate. The surface was polished for 60 minutes such that a polishing pressure of 19.6 kPa (or 200 gf/cm$^2$) to 98 kPa (or 1,000 gf/cm$^2$) was applied and the GaN crystal substrate (or group III nitride crystal 1) and surface plate 15 were rotated 30 to 120 times/min.

Then, similarly as has been described in the first comparative example, the GaN crystal had its surface washed. The GaN crystal substrate washed with pure water was examined for impurity remaining on the surface. $1\times10^{13}$ Sn atoms/cm$^2$, $1\times10^{12}$ Cu atoms/cm$^2$ and $1\times10^{12}$ Zn atoms/cm$^2$ were detected.

Fifth Example

With reference to FIG. 2, the GaN crystal substrate of the fourth comparative example was polished with basic polishing liquid 27 of an aqueous solution which contains 0.3 mol/l of ammonium, 0.1 mol/l of hydrogen peroxide and a chelate implemented by 0.1 mol/l of EDTA, and has a pH of 11 and an ORP of 500 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min. Then, similarly as has been described in the first comparative example, the GaN crystal substrate had its surface washed with pure water. The GaN crystal substrate washed with pure water was examined for impurity remaining on the surface. $3\times10^{10}$ Sn atoms/cm$^2$, $5\times10^{10}$ Cu atoms/cm$^2$ and $5\times10^{10}$ Zn atoms/cm$^2$ were detected. Polishing with a basic polishing liquid containing a chelate, as described in the present example, has significantly reduced impurities, such as Sn, Cu, Zn and the like, remaining on the surface of the GaN crystal substrate.

Fifth Comparative Example

Similarly as has described in the first comparative example, a GaN crystal substrate of 0.5 mm in thickness was obtained. With reference to FIG. 1, the GaN crystal substrate (or group III nitride crystal 1) had a surface polished with polishing slurry 17 which contains abrasive grains of SiO$_2$ having an average grain size of 0.1 and abrasive grains of Cr$_2$O$_3$ having an average grain size of 0.3 μm and has a pH of 2.5 and an ORP of 1,100 mV. Polishing pad 18 was implemented by a polyurethane suede pad (Supreme RN-R produced by Nitta Haas Incorporated) and surface plate 15 was implemented by a stainless steel surface plate. The surface was polished for 60 minutes such that a polishing pressure of 19.6 kPa (or 200 gf/cm$^2$) to 98 kPa (or 1,000 gf/cm$^2$) was applied and the GaN crystal substrate (or group III nitride crystal 1) and surface plate 15 were rotated 30 to 120 times/min.

Then, similarly as has been described in the first comparative example, the GaN crystal had its surface washed with pure water. The GaN crystal substrate washed with pure water was examined for impurity remaining on the surface. $5\times10^{12}$ Si atoms/cm$^2$ and $1\times10^{12}$ Cr atoms/cm$^2$ were detected.

Sixth Example

With reference to FIG. 2, the GaN crystal substrate of the fifth comparative example was polished with basic polishing liquid 27 of an aqueous solution containing 0.1 mol/l of choline and 0.05 mol/l of hydrogen peroxide and having a pH of 12 and an ORP of 800 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min.

Then, the GaN crystal substrate having been polished with the basic polishing liquid was, again with reference to FIG. 2, polished with acidic polishing liquid 27 of an aqueous solution containing 0.05 mol/l of hydrochloric acid and 0.1 mol/l of hydrogen peroxide and having a pH of 3 and an ORP of 700 mV. Polishing pad 28 was implemented by a polyurethane suede pad (Supreme RN-R produced by Nitta Haas Incorporated) and surface plate 25 was implemented by a stainless steel surface plate. The substrate was polished for 20 minutes such that a polishing pressure of 19.6 kPa (or 200 gf/cm$^2$) to 49 kPa (or 500 gf/cm$^2$) was applied and the GaN crystal substrate (or group III nitride crystal 1) and surface plate 25 were rotated 30 to 120 times/min.

Then, similarly as has been described in the first comparative example, the GaN crystal substrate had its surface washed with pure water. The GaN crystal substrate washed with pure water was examined for impurity remaining on the surface. $1\times10^{11}$ Si atoms/cm$^2$ and $1\times10^{10}$ Cr atoms/cm$^2$ were detected. Polishing with an alkaline polishing liquid and polishing with an acidic polishing liquid, as described in the present example, has reduced significantly more of impurity remaining on the surface of the GaN crystal substrate than the fifth comparative example.

In the fifth comparative example and the present example, in particular, the step of polishing with a polishing slurry containing their abrasive grains is performed such that abrasive grains of SiO$_2$ and those of Cr$_2$O$_3$ smaller and larger, respectively, in hardness than the group III nitride crystal are used to allow the crystal to have a surface enhanced in smoothness and to allow the surface to be polished faster. Furthermore, the abrasive grains of SiO$_2$ are formed of SiO$_2$, which is a base soluble material, and the abrasive grains of Cr$_2$O$_3$ are formed of Cr$_2$O$_3$, which is an acid soluble material. Thus the group III crystal substrate having a surface polished with polishing slurries containing abrasive grains of a base soluble material such as SiO$_2$ and those of an acid soluble material such as Cr$_2$O$_3$, respectively, can be polished with an alkaline polishing liquid and an acidic polishing liquid to reduce impurities deriving from both types of abrasive grains.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A group III nitride crystal substrate including an exposed main surface on which at least one element selected from the group consisting of Fe, Cr, Sn, Cu, Si and Zn remains at not more than $1\times10^{11}$ atoms/cm$^2$.

2. The group III nitride crystal substrate of claim 1, wherein the at least one element selected from the group consisting of Fe, Cr, Sn, Cu, Si and Zn remains on the exposed main surface at not less than $1\times10^{10}$ atoms/cm$^2$ and not more than $1\times10^{11}$ atoms/cm$^2$.

* * * * *